Aug. 18, 1970 R. C. CHU ET AL 3,524,497

HEAT TRANSFER IN A LIQUID COOLING SYSTEM

Filed April 4, 1968

INVENTORS
RICHARD C. CHU
MARTIN G. COHEN
OMKARNATH GUPTA

BY

ATTORNEY 3,524,497

HEAT TRANSFER IN A LIQUID COOLING SYSTEM

Richard C. Chu, Martin G. Cohen, and Omkarnath Gupta, Poughkeepsie, N.Y., assignors to International Business Machines Corporation, Armonk, N.Y., a corporation of New York Filed Apr. 4, 1968, Ser. No. 718,856
Int. Cl. F28f 7/00; H01l 1/12
U.S. Cl. 165—80 6 Claims

ABSTRACT OF THE DISCLOSURE

Electronic components, such as semiconductors, are mounted on one end of heat conducting cooling studs. The semiconductor carrying ends of the cooling studs aer connected to one side of a circuit board. The circuit board forms one wall of a narrow channel thru which cooling liquid is forced to flow. The studs extend from the wall into the channel in spaced relationship with respect to one another. Further studs, connected to the opposite wall, extend into the channel, parallel to the cooling studs and in spaced, staggered relation thereto. The further studs cause an increase in the turbulence of the flowing liquid around the heat conducting studs and direct the flow of cooling liquid over a greater area of the cooling studs, thus increasing the heat transfer therefrom.

This invention relates to an improved liquid cooling system, and more particularly, to an improved liquid cooling system for electronic components wherein the heat transfer rate to a flowing cooling liquid is improved so that the temperature of the electronic components can be maintained within their predetermined limits with a smaller cooling liquid flow rate.

It is known that the reliability of many electronic components, such as semiconductor devices, decrease with increasing temperature. Also, it is known that the operating characteristics of such devices vary appreciably over the temperature range of operation so that the performance will begin to deteriorate to a degree rendering the device unusable for many purposes long before such a temperature causing a complete failure has been reached.

The general means utilized for providing cooling for electronic components, such as semiconductor devices, is a heat sink. This generally consists of a large heat conducting plate to which the components are attached in heat conducting relation. With the increase in miniaturization and the consequent improvement in packaging density, improved heat removal techniques have become necessary. One improvement has been the use of a coldplate upon which the components to be cooled have been mounted. The coldplate has been cooled by applying a cooling means, such as a cooling liquid, to the other side thereof. Various problems have been encountered in using coldplates. It has been found that a boundary layer forms along the coldplate when the cooling liquid is flowing. Another problem, which is encoutered, is the limited plate area available for heat transfer when there is a high density of components on the plate. One means of obtaining better heat transfer with a limited heat transfer area has been to increase the rate of flow of the cooling fluid. Another means of improving the heat transfer from a coldplate is to increase the area of heat transfer by introducing fins or heat conducting studs extending into the liquid thus increasing the heat transfer area without increasing the size of the coldplate. The cooling studs extending into the flowing cooling liquid, not only provide a greater surface area for contacting by the cooling liquid, but also prevent any extensive buildup of boundary layers.

The present invention provides a further improvement in the rate of heat transfer by mounting the semiconductor devices directly on the cooling stud and connecting the semiconductor device and cooling stud to the inside surface of a wall of a flowing liquid channel. The rate of heat transfer is further improved by providing turbulator studs in spaced, staggered relation with the cooling studs. The turbulator studs are located with respect to the cooling studs such that the turbulence in the liquid is increased and the flow around the cooling stud is improved to obtain better heat transfer. When a flowing liquid is intercepted by a submerged stud, a boundary layer forms on the stud surface. Actually, the boundary layer is caused by the velocity differences of the flowing liquid adjacent the stud. Viscous forces impede the flow of the liquid at the stud surface while the velocity of the liquid adjacent thereto but further from the stud has a greater velocity until a point is reached where the velocity is the free stream velocity of the flowing liquid. This velocity profile is the boundary layer previously referred to. This boundary layer usually separates from the cooling stud just beyond the thickest point cross-stream to the flow. The fluid beyond the separation point, adjacent to the stud, has eddy currents therein which dissipate the kinetic energy of the flowing fluid and prevent good heat transfer from this area of the stud. If the turbulator stud is properly placed with respect to the cooling stud, it provides a coolant flow passage by means of which the separation point of the boundary layer can be controlled. Thus, a properly designed turbulator stud not only increases the turbulence about the cooling stud but delays the separation of the boundary layer so that the boundary layer follows the curve of the stud beyond the usual separation point. The delay of the separation point substantially eliminates the undesired eddy currents. The effect of the turbulator studs is to improve the heat transfer from the cooling studs to the cooling liquid. Accordingly, the flow rate can be reduced and the desired cooling effect maintained so that the electronic components remain within their thermal operating range. The reduced flow rate allows a smaller pump to be used which is an important weight and economy consideration.

It is the main object of the present invention to provide an improved heat transfer in a liquid cooling system.

Another object of the present invention is to provide a cooling assembly for electronic components which eliminates the coldplate of the prior art.

It is another object of the present invention to provide a cooling assembly in which the flow rate of the cooling liquid is reduced and the cooling is sufficient to maintain the electronic components within their thermal operating range.

It is another object of the present invention to provide a cooling assembly of the liquid cooled type in which flow balancing effects can be easily introduced.

It is a further object of the present invention to provide a cooling assembly in which an auxiliary cooling means can be simply introduced to provide a further control of the cooling.

It is another object of the present invention to provide a cooling assembly of sufficient cooling efficiency and improved packaging in which further devices to be cooled can be added without affecting the packing density or increasing the size of the package.

A cooling assembly for providing cooling for electronic components is provided having a first and second wall located parallel to one another and displaced by a small amount defining a narrow channel. A cooling liquid is forced through the narrow channel and is intercepted by cooling studs upon which the electronic components to be cooled are mounted. The studs are connected to one of the walls and extend therefrom into the narrow channel in parallel, spaced relation to conduct the heat from the components to the flowing liquid. Turbulator studs are located in the narrow channel in staggered, spaced relation with the cooling studs so as to produce turbulence about the adjacent cooling studs and direct the flow of cooling liquid over a greater area of said cooling studs, thereby improving the heat transfer.

The foregoing and other objects, features and advantages of the invention will be apparent from the following more particular description of preferred embodiments of the invention, as illustrated in the accompanying drawings.

Figure 1:
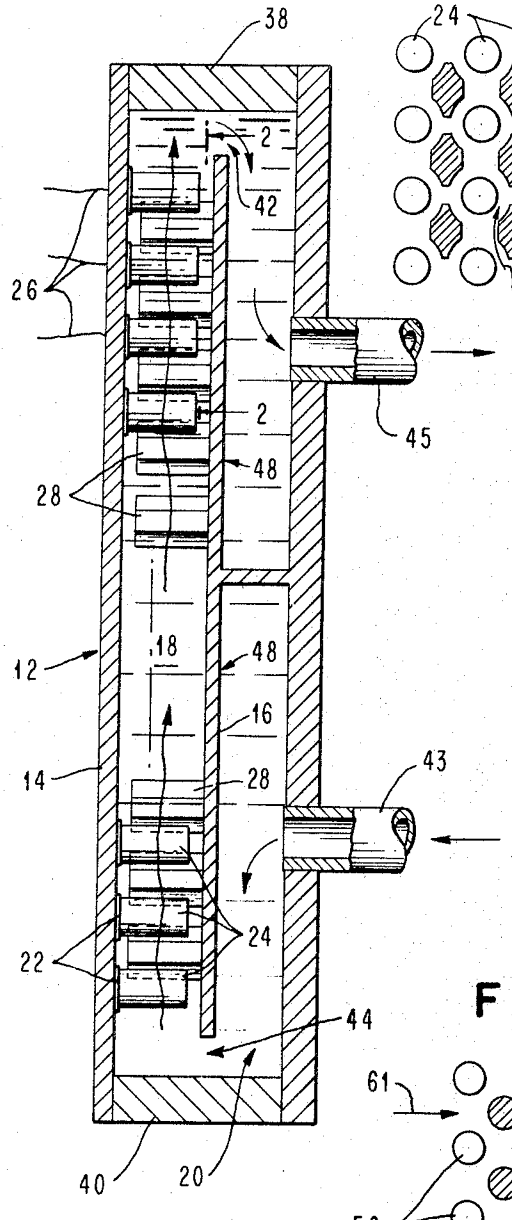
FIG. 1 is a cross sectional end view of a liquid cooled assembly showing the cooling and turbulator studs extending from the respective walls.
Figure 2:
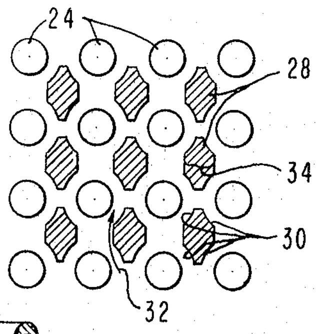
FIG. 2 is a schematic view taken along the line 2—2 of FIG. 1 showing the shape and location with respect to one another of the cooling and turbulator studs.

Referring to FIG. 1, the cooling assembly 12 of the present invention consists of a first and second wall 14, 16 which are parallel and which define a channel 18 therebetween through which a coolant 20 is forced to flow. The wall 14 is a laminated printed circuit board of the usual construction upon which printed circuits can be easily provided. The wall 16 is constructed of a good heat conducting metal, however, it could be made of other materials, such as plastic, when its additional cooling capabilities are not necessary. The components 22, to be cooled, are mounted on one end of studs 24. The studs 24 are made of a good heat conducting material such as copper. The components are attached to the inside face of the first wall 14 of the cooling assembly 12 so that the studs 24 extend into the channel 18 between the first and second walls 14, 16 in parallel, evenly spaced relation where they are cooled by the flowing coolant liquid 20. The components 22, particularly being considered, are semiconductor electronic components which generate heat during operation. The operating characteristics of such devices are very sensitive to temperature and, accordingly, they must be provided with sufficient cooling to maintain the temperature in the required operating range. Electrical connections 26 are made to the electronic components. These electrical connections and additional electrical connections can be made in the form of printed circuits on the wall board 14. It is desired to package these miniaturized components in a unit as small as possible. Accordingly, the packing density on the wall board 14 is extremely high. The limitations of packing density are not introduced by the cooling but by the size and interference encountered between the components 22 themselves. It has been found, that the rate of heat transfer from the cooling studs 24 can be improved by the insertion of turbulator studs 28 in spaced, staggered relation with the cooling studs, as shown in FIG. 2. It has also been found, that a good design for the turbulator studs 28 is to have four curved surfaces 30 thereon, each of which faces a different one of the adjacent cooling studs 24. This provides a particular passage way 32 between the cooling studs 24 and the turbulator studs 28. The effect of the passage way 32 is to increase the turbulence, but most importantly, it maintains the flow against the cooling stud over a longer path. As was previously mentioned, the boundary layer or velocity profile buildup along the cooling stud has a tendency to separate from the stud a little beyond the widest cross stream dimension 34. This results in eddy currents being set up adjacent the portion of the surface of the cooling stud beyond the separation point. These eddy currents do not provide good cooling circulation and they dissipate the kinetic energy of the flowing liquid. Accordingly, the path 32 set up between each of the cooling studs 24 and the turbulator studs 28 not only increases the turbulence of the liquid near the cooling stud but controls the boundary layer separation point of the flowing liquid so that it occurs further back along the back portion of the cooling stud, thereby providing a greater interface area between the flowing liquid and the cooling stud. The curved surfaces 30 of the turbulator stud 24 correspond to the curvature of the cooling stud 24. The radius of the curved surface 30 of the turbulator stud 28 is equal in length to the diameter of the cooling stud 24. This radius is measured from the center of the cooling stud 24. One of the advantages of improving the rate of heat transfer from the cooling stud 24 is that the flow rate can be accordingly reduced. Thus, the size and expense of the pump can be considerably reduced since the reduced flow rate requires a much smaller pump. The turbulator studs 28 are shown extending from the plate 16 of the channel 18 and are arranged parallel to the cooling studs 24. The distance between the plates 14, 16 or the channel 18 width is determined by the length of the cooling studs 24. It will be appreciated that the longer the stud 24, the greater the area that the cooling fluid 20 has to contact and thus the higher the cooling rate can be made. Thus, the length of the studs 24 is determined not only by the required cooling but by overall space and economic considerations. It has been found, by experimentation, that a 42% improvement in cooling efficiency is obtained by introducing turbulator studs in spaced, staggered relation with cooling studs in a liquid cooled cooling assembly where the cooling studs are .125″ in diameter and the centers of adjacent cooling studs are displaced from one another by .245″ and where the turbulator studs are .125″ wide and .375″ long with each curved surface located on a radius of .125″ from the center of the adjacent cooling stud.

The channel wall 16, to which the turbulator studs 28 are attached, has the further advantage that, in addition to the turbulator studs 28, a dummy stud (not shown) can be easily inserted in those positions where an electronic component and, consequently, a cooling stud is not included on wall 14. Thus, where a component carrying board 14 is not fully populated, the empty positions can be easily compensated for by a dummy stud detachably connected to the turbulator stud board 16 so that balanced flow conditions in the flow channel 18 can be maintained. In the event that an electronic component 22 with its cooling stud 24 is subsequently required, the dummy cooling stud can be easily removed from the turbulence stud board 16.

Referring again to FIG. 1, it will be noted, that the turbulator stud mounting board 16 does not extend all the way to the top and bottom walls 38, 40 of the cooling assembly 12, but has openings 42, 44 between the top and bottom walls 38, 40 and the board 16 so that the cooling fluid 20 can flow to the back of the board 16. Ordinarily, the inlet and outlet of the heat exchanger 12 would be located at the top and the bottom of the channel 18 and the turbulator stud carrying board 16 would extend all the way to the top and bottom walls 38, 40, thus providing an inlet and an outlet connected directly to the channel between the two walls 14, 16. The arrangement, as shown in FIG. 1, with the inlet 43 and the outlet 45 at the back of the turbulator stud carrying board 16 provides further control of the cooling. This is accomplished by making the turbulator stud 28 and board 16 of a good heat conducting material so that some of the heat transferred to the cooling liquid 20 is given up to the turbulator studs 28 and conducted to the board 16 to which it is mounted. Thus, the cooling liquid 20 flows along the back surface 48 of the turbulator stud carrying board 16 to provide additional cooling. It should also be noted, that the channel 18 is extended to run along the back of the board 16 below and above both the inlet 43 and outlet 45. This provides more surface area to which the cooling fluid can be applied at the back of the board 16 to further improve the cooling.

Figure 3:
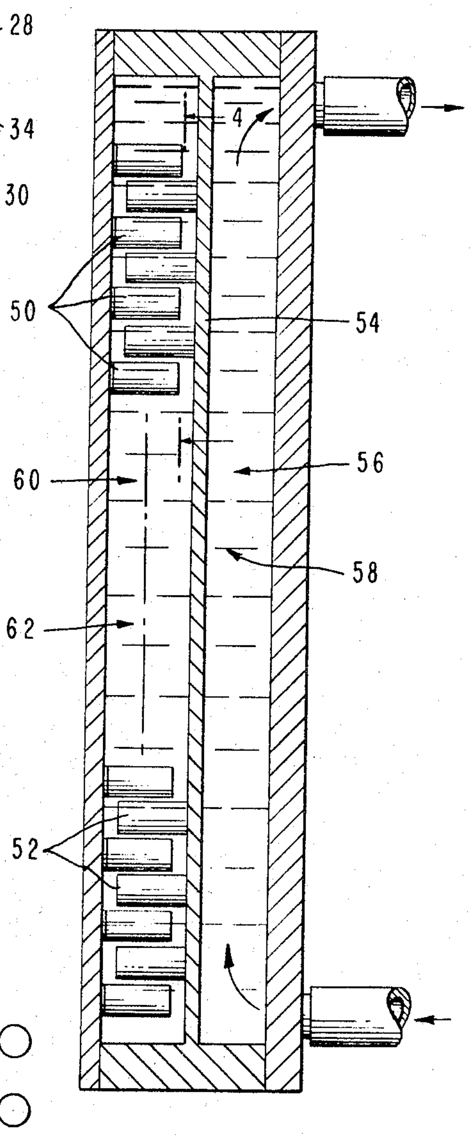
FIG. 3 is a cross sectional end view of another embodiment of a heat exchanger showing an auxiliary means for providing additional temperature control.

There are two modes of cooling which are generally utilized in connection with this type of cooling assembly. One mode is the well known convective method, wherein the flowing liquid is the cooling material. The other method is known as flow-boiling. Which method is used, is dependent on what type of liquid coolant is utilized. In the convective method, an ordinary dielectric coolant is utilized, whereas in the flow-boiling method one of the new low-boiling-point liquids, such as a fluorocarbon, is utilized. In the flow-boiling system, nucleate boiling takes place at the cooling studs 24 and the heat is transferred in the form of vapor bubbles some of which condense in the flowing liquid and others of which condense upon contacting a colder object. Accordingly, there is shown in FIG. 3 a further embodiment of the invention in which the flow-boiling method of cooling might be more efficiently utilized.

Figure 4:
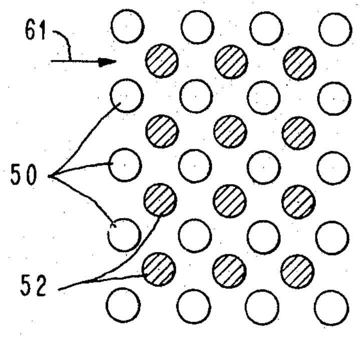
FIG. 4 is a schematic view taken along the line 4—4 of FIG. 3 showing the shape and location of the cooling and turbulator studs.

The cooling studs 50 and the turbulator studs 52 are shown in FIG. 4 as cylindrical shapes of substantially the same diameter. This arrangement gives the same operation as the previously described turbulator studs 28. However, the efficiency of heat transfer is not as good. The cooling fluid 60 in the embodiment shown in FIG. 3, flows into the paper. The direction of flow is more clearly shown by arrow 61 in FIG. 4. The turbulator stud wall 54 also forms one wall of a further channel 56 through which another coolant 58, such as chilled water, is circulated. By means of this technique, the turbulator stud board 54 and the turbulator studs 52 can be maintained at a desired temperature. Thus, in the case of a flow-boiling system, a condensation of the vapor bubbles at the turbulator studs 52 and plate 54 is enhanced. Of course, the same effect is obtained in the case of straight convective cooling, wherein the heat transferred to the cooling fluid 60 flowing through the stud populated channel 62 transfers some of its accumulated heat to the cooled turbulator studs 52 and plate 54. By this means of auxiliary cooling, a closer control of the temperature and, accordingly, the amount of cooling can be maintained.

It should be appreciated, that the turbulator studs 52 can also be cooling studs. That is, they can be made of a good heat conducting material, such as copper, and can have heat generating electronic components, such as semiconductor devices, located on the end thereof which is connected to the channel wall 54. This channel wall 54 can also be of a laminated board construction and can have printed circuits located thereon connected to the semiconductor components. Thus, all the studs can be cooling studs and each acts as a turbulator stud for each adjacent stud. Such an arrangement doubles the number of electronic components which can be cooled without increasing the size of the package.

The use of heat conductive studs, to which the electronic components are attached, extending into the flowing coolant and the use of turbulator studs, in spaced, staggered relationship with the heat conductive studs to improve the cooling efficiency, provides an improved cooling assembly for use with high density packaged electronic components.

It will be appreciated, that the studs are not limited to the shapes described above. Also, various patterns other than the staggered arrangement set forth herein are possible.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A cooling assembly for providing cooling for electronic components comprising:

a first and second wall located parallel to one another and displaced by a small amount defining a narrow channel therebetween;

a cooling liquid constrained to flow through said narrow channel between said first and second walls;

heat generating electronic components;

cylindrical cooling studs upon which said electronic components are mounted, attached to, and extending from said first wall into said narrow channel; and turbulator studs located in said narrow channel parallel to and in staggered relationship with said cooling studs;

four curved surfaces on each of said turbulator studs, each of which face a respective cooling stud and each of which has the same curvature as said respective cooling stud thereby forming a channel between said turbulator stud and each one of the adjacent upstream and downstream cooling studs to confine the flowing fluid therein so that the fluid will stay in contact with the cooling stud over a greater area thereby increasing the heat transfer therefrom.

2. A cooling assembly in accordance with claim 1, wherein the radius of each of the curved surfaces of each of the turbulator studs extend from the center of the facing cooling stud a distance equal to the diameter of the cooling stud, each turbulator stud measuring a like amount cross stream at its widest part.

3. A cooling assembly in accordance with claim 1, wherein said turbulator studs located in said narrow channel extend therein from said second wall to which they are attached.

4. A cooling assembly in accordance with claim 3, wherein inlet and outlet passages for the cooling fluid run along the back of the second wall to provide additional heat removal from the narrow channel via the turbulator studs and second wall.

5. A cooling assembly in accordance with claim 3, wherein said second wall also forms a wall of a chamber through which further cooling liquid is circulated to provide further control of the temperature within the narrow channel and accordingly provide further control of the cooling.

6. A cooling assembly in accordance with claim 3, wherein said turbulator studs are made of a good heat conductor and have further electronic components to be cooled mounted thereon.

References Cited

UNITED STATES PATENTS

| | | | |
|---|---|---|---|
| 2,780,757 | 2/1957 | Thornhill et al. | 317—234 |
| 3,270,250 | 8/1966 | Davis | 317—100 |
| 3,405,323 | 10/1968 | Surty et al. | 317—100 |
| 3,406,753 | 10/1968 | Habdas | 165—185 |

FOREIGN PATENTS 961,344 11/1949 France.

ROBERT A. O'LEARY, Primary Examiner

A. W. DAVIS, Jr., Assistant Examiner

U.S. Cl. X.R.

165—104, 166, 185; 174—15; 317—100, 234